United States Patent
Polley et al.

(10) Patent No.: US 9,778,288 B2
(45) Date of Patent: Oct. 3, 2017

(54) FLUXGATE-BASED CURRENT SENSOR

(71) Applicant: Texas Instruments Incorporated, Dallas, TX (US)

(72) Inventors: Arup Polley, Richardson, TX (US); Srinath Ramaswamy, Murphy, TX (US); Terry Lee Sculley, Lewisville, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 146 days.

(21) Appl. No.: 14/986,121

(22) Filed: Dec. 31, 2015

(65) Prior Publication Data
US 2017/0059627 A1    Mar. 2, 2017

Related U.S. Application Data

(60) Provisional application No. 62/209,074, filed on Aug. 24, 2015.

(51) Int. Cl.
*G01R 15/18* (2006.01)
*G01R 19/00* (2006.01)

(52) U.S. Cl.
CPC ....... *G01R 15/185* (2013.01); *G01R 19/0092* (2013.01)

(58) Field of Classification Search
CPC .......................... G01R 15/185; G01R 19/0092
USPC .......................................... 324/76, 126, 127
See application file for complete search history.

(56) References Cited

U.S. PATENT DOCUMENTS

| | | | |
|---|---|---|---|
| 2006/0145690 A1* | 7/2006 | Shoji ..................... | B82Y 25/00 324/207.21 |
| 2012/0049839 A1* | 3/2012 | Kiendl ................ | G01R 15/181 324/127 |
| 2016/0139221 A1* | 5/2016 | Overweg ........... | G01R 33/3815 324/322 |

OTHER PUBLICATIONS

"Magnetometer", Wikipedia, available at https://en.wikipedia.org/wiki/Magnetometer on Dec. 7, 2015, pp. 1-18.
Arup Polley et al, "Removal of Higher Order Magnetic Interference in Magnetic Field Based Current Sensors", U.S. Appl. No. 14/941,319, filed Nov. 13, 2015, pp. 1-23.
"DRV421 Integrated Magnetic Fluxgate Sensor for Closed-Loop Current Sensing", SBOS704A, Texas Instruments Incorporated, May 2015, Revised Jul. 2015, pp. 1-41.

\* cited by examiner

*Primary Examiner* — Giovanni Astacio-Oquendo
(74) *Attorney, Agent, or Firm* — John R. Pessetto; Charles A. Brill; Frank D. Cimino

(57) ABSTRACT

Operating a current sensor by conducting a current serially through a first region and a second region of an electrically conductive member. A first magnetic field produced by the current in the first region is sensed using a first magnetic field based current (MFBC) sensor having a first sensitivity. The sensitivity of a second MFBC is reduced. A second magnetic field produced by the current in the second region is sensed using the second MFBC sensor having a reduced sensitivity, in which the reduced sensitivity is lower than the first sensitivity. A magnitude of the current is calculated based on the first magnetic field and the second magnetic field. A dynamic range of the current sensor is extended by calculating a magnitude of the current using the second magnetic field after the first MFBC is saturated.

17 Claims, 10 Drawing Sheets

FLUXGATE-BASED CURRENT SENSOR

CLAIM OF PRIORITY UNDER 35 U.S.C. 119 (e)

The present application claims priority to and incorporates by reference U.S. Provisional Application No. 62/209,074, filed Aug. 24, 2015, entitled "Methods and Architectures for In-package Fluxgate-based Current Sensor."

FIELD OF THE INVENTION

This disclosure relates to a Fluxgate-based current sensor, and in particular to sensor that is packaged in a compact integrated circuit type package.

BACKGROUND OF THE INVENTION

In a magnetic field based non-contact current sensor, current through a low-resistance metal trace creates a magnetic field that is sensed by a magnetic sensor. The intensity of the created magnetic field may be proportional to the current flowing through the trace. There are many types of magnetometers that may be used for measuring a magnetic field; see, e.g. "Magnetometer", Wikipedia, as of Dec. 7, 2015. One type of magnetometer that is commonly used for current sensing applications is a Hall device.

Another magnetometer that is commonly used for current sensing applications is the fluxgate magnetometer. Fluxgate magnetometers (FGM) were invented in the 1930s by Victor Vacquier at Gulf Research Laboratories. A fluxgate magnetometer consists of a small, magnetically susceptible core wrapped by two coils of wire. An alternating electric current is passed through one coil, driving the core through an alternating cycle of magnetic saturation; i.e., magnetized, unmagnetized, inversely magnetized, unmagnetized, magnetized, and so forth. This constantly changing field induces an electric current in the second coil, and this output current is measured by a detector. In a magnetically neutral background, the input and output currents will match. However, when the core is exposed to a background field, it will be more easily saturated in alignment with that field and less easily saturated in opposition to it. Hence the alternating magnetic field, and the induced output current, will be out of step with the input current. The extent to which this is the case will depend on the strength of the background magnetic field. The current in the output coil may be integrated over a period of time to yield an analog voltage proportional to the magnetic field.

BRIEF DESCRIPTION OF THE DRAWINGS

Particular embodiments in accordance with the invention will now be described, by way of example only, and with reference to the accompanying drawings.

Figure 1:
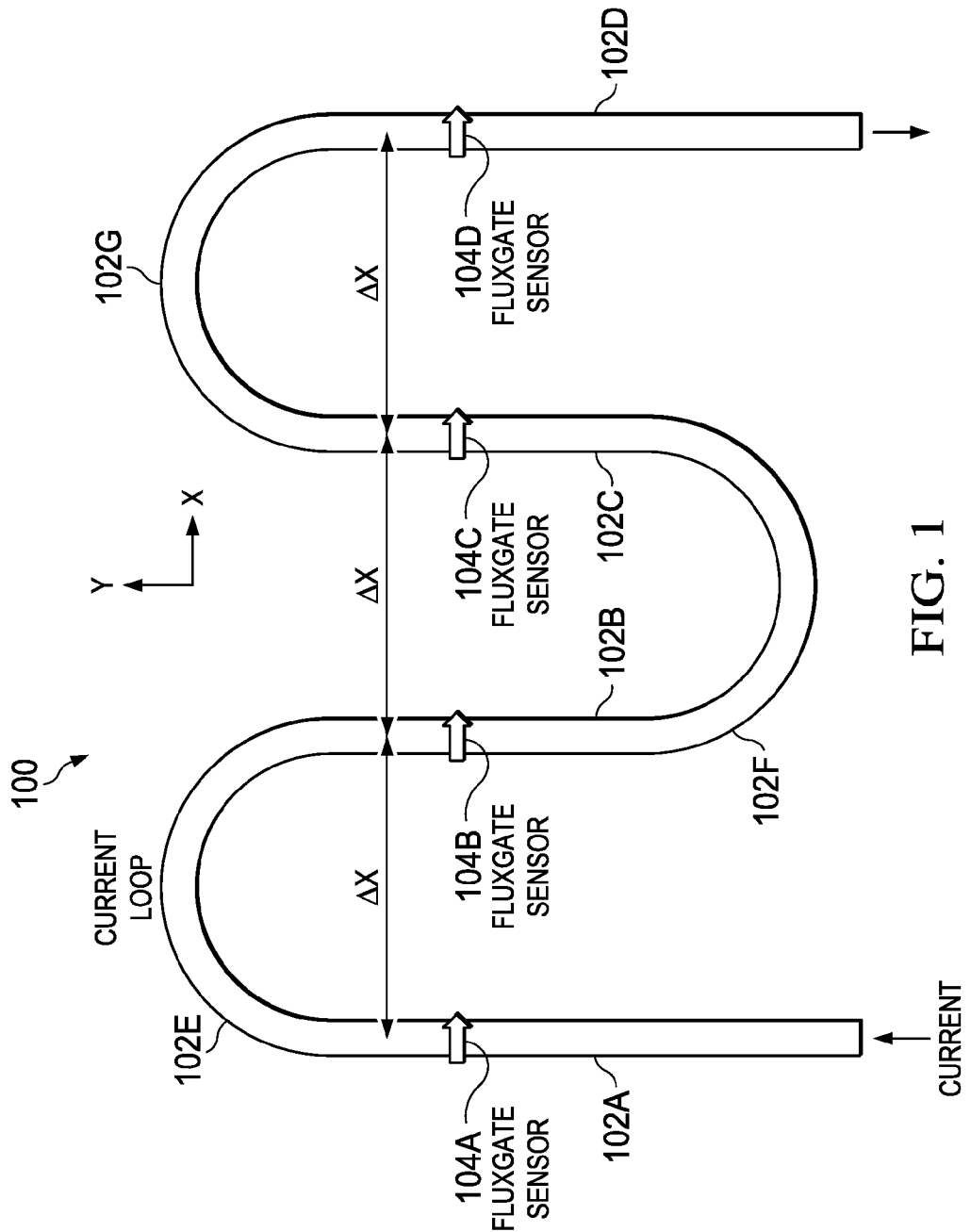
FIG. 1 is an illustration of a current sensor that includes multiple fluxgate sensors for reducing interference.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

An integrated microFluxgate sensor is a highly accurate, low noise magnetic field sensor that senses magnetic field parallel to the sensor/die plane. In an integrated magnetic field based non-contact current sensor, current through a low-resistance metal trace creates a magnetic field that may be sensed by a magnetic sensor. Intensity of the created magnetic field is typically proportional to the current flowing through the trace. Embodiments of the present disclosure provide an integrated microFluxgate sensor that provides extraneous magnetic field interference cancelation and a high dynamic range, as will be described in more detail below.

The general operation of fluxgate sensors is well known; see e.g. "Magnetometer", from Wikipedia as of Nov. 27, 2015. A typical fluxgate magnetometer includes a "sense" (secondary) coil surrounding an inner "drive" (primary) coil that is closely wound around a highly permeable core material, such as mu-metal. An alternating current is applied to the drive winding, which drives the core in a continuous repeating cycle of saturation and unsaturation. To an external field, the core is alternately weakly permeable and highly permeable. The core is often a toroidally-wrapped ring or a pair of linear elements whose drive windings are each wound in opposing directions. Such closed flux paths minimize coupling between the drive and sense windings. In the presence of an external magnetic field, with the core in a highly permeable state, such a field will be locally attracted or gated (hence the name fluxgate) through the sense winding. When the core is weakly permeable, the external field will not be so attracted. This continuous gating of the external field in and out of the sense winding induces a signal in the sense winding, whose principal frequency is twice that of the drive frequency, and whose strength and phase orientation vary directly with the external field magnitude and polarity.

Phase synchronous detection may be used to extract these harmonic signals from the sense winding and convert them into a DC voltage proportional to the external magnetic field. Active current feedback may also be employed, such that the sense winding is driven to counteract the external field. In such cases, the feedback current varies linearly with the external magnetic field and is used as the basis for measurement. This helps to counter inherent non-linearity between the applied external field strength and the flux gated through the sense winding.

Micro-fluxgate magnetometers (MFGM), which are based on CMOS (complementary metal oxide semiconductor) or MEMS (micro-electromechanical) technology, appeared in 1990s. Compared with a traditional fluxgate magnetic sensor, MFGM has some advanced features, such as less mass, smaller size, less power consumption, better performance, and batch production. Micro-fluxgate devices may be fabricated using layered spiral coils, for example. For the planar design, the in-plane spiral coils can be readily fabricated by using standard CMOS or MEMS processes, for example.

Related U.S. patent application Ser. No. 14/941,319; filed 13 Nov. 2015; by Arup Polley et al, entitled "Removal of Higher Order Magnetic Interference in Magnetic Field Based Current Sensors" is incorporated by reference herein and referred to herein as "Polley". A brief description of the use of multiple sensors to remove magnetic interference is described herein with reference to FIG. 1.

FIG. 1 is an illustration of a current sensor 100 that includes multiple fluxgate sensors 104A-104D for reducing interference by external magnetic fields, as described in more detail in Polley. In this example, current trace 102 is a conductive material having a substantially constant cross-sectional profile, which may be round, square or rectangular. The conductive material can be aluminum, copper, or any other conductive material currently known or unknown. In this figure, trace 102 has been narrowed to concentrate the magnetic field. Trace 102 includes four substantially parallel sections 102A, 102B, 102C, 102D. Adjacent parallel sections are joined by loop sections 102E, 102F, 102G. That is, parallel sections 102A and 102B are joined by loop section 102E; parallel sections 102B and 102C are joined by loop section 102F; and parallel sections 102C and 102D are joined by loop section 102G. Magnetic field based current sensors 104A, 104B, 104C, 104D are placed above a respective parallel section of trace 102 to measure the current therein. For purposes of discussion the XY coordinates are defined as shown in the figure, although in order to calculate the X component of an interference field, the X-axis is defined to run through current sensors 104. Each adjacent pair of parallel sections of trace 102 is separated by a distance $\Delta X$. It can be noted that magnetic field based current sensors 104A, 104B, 104C, 104D are arranged in a linear fashion in the embodiment shown. In some embodiments, magnetic field based current sensors 104 are not totally linear, e.g., through process variation. In such instances, the results are still an improvement over the previous solutions, although the accuracy may be somewhat affected. In at least one embodiment the magnetic field based current sensors are fluxgate sensors. In an alternate embodiment, magnetic field based current sensors 104 may be magneto-resistive (XMR) sensor elements, such as anisotropic magneto-resistive (AMR), giant magneto-resistive (GMR), tunneling magneto-resistive (TMR), and colossal magneto-resistive (CMR), for example.

As noted previously, the disclosed arrangement of trace 102 and magnetic field based current sensors 104 is designed in such a way that an appropriate combination of sensor signals will cancel magnetic interference of higher orders while not reducing the signal component of the current measurement. The magnetic field S sensed by each of magnetic field based current sensors 104A, 104B, 104C, 104D can be written as expression (1).

$$S = B_I + B_{interference} \tag{1}$$

where $B_I$ is the desired magnetic field proportional to current I and $B_{interference}$ is the magnetic field proportional to the interference.

It is known that the x component of a magnetic field expanded in Taylor series around x=0 may be shown as in expression (2).

$$B_x(x) = B_{x,0} + B_{x,1}x + B_{x,2}x^2 + \tag{2}$$

Therefore, the interference magnetic field may be written as expression (3).

$$B_{x,interference}(x) = B_0 + B_1 x + B_2 x^2 + \tag{3}$$

Using the coordinate system as shown in FIG. 1, the field sensed by each of magnetic field based current sensors 104A, 104B, 104C, 104D may be written as expressions (4)-(7).

$$S_A = B_1 + B_0 - 3/2 B_1 \Delta x + 9/4 B_2 \Delta x^2 + \tag{4}$$

$$S_B = -B_1 + B_0 - 1/2 B_1 \Delta x + 1/4 B_2 \Delta x^2 + \tag{5}$$

$$S_C = B_1 + B_0 - 1/2 B_1 \Delta x + 1/4 B_2 \Delta x^2 + \tag{6}$$

$$S_D = -B_1 + B_0 - 3/2 B_1 \Delta x + 9/4 B_2 \Delta x^2 + \tag{7}$$

In order to obtain a cancellation of the interfering magnetic field up to second order interference, equation (8) may be used.

$$\frac{3(S_C - S_B) - (S_D - S_A)}{8} = B_I + \text{interference of order} \geq 3 \tag{8}$$

i.e., we are left with only the original signal and interference of order three or greater.

The system shown in FIG. 1 may be extended further by increasing the number of parallel and loop sections and sensors to an arbitrarily large value. The sensors may be combined to calculate a value for the magnetic field generated by the current ($B_I$) with rejection of higher order interference terms, such that if N sensors are used, the interference terms up to order N−2 are removed. The calculation is performed by multiplying the sensors by the coefficients of a binomial expansion with alternating terms, summing those values, and dividing the final sum by $2^{(N-1)}$. In the example system shown in FIG. 1 four sensors are used in calculation such that sensors A/B/C/D are multiplied by the binomial expansion coefficients [+1, −3, +3, −1], and then divided by $2^{(4-1)} = 8$. That is, the equation above can be rewritten as expression (9).

$$B_I + \text{interference of order} \geq 3 = \frac{(S_A - 3S_B + 3S_C - S_D)}{8} \tag{9}$$

A system with six sensors may be used in a similar calculation such that sensors A/B/C/D/E/F are multiplied by the binomial expansion coefficients [+1, −5, +10, −10, +5, −1], and then divided by $2^{(6-1)}=32$. The results are shown by expression (10), $$B_I + \text{interference of order} \geq 5 = \frac{(S_A - 5S_B + 10S_C - 10S_D + 5S_E - S_F)}{32} \quad (10)$$

This equation can thus be generalized for N sensors, where N is even, as shown in expression (11).

$$B_I + \text{interference of order} \geq (N-1) = \frac{\left(S_1 - \binom{N}{1}S_2 + \binom{N}{2}S_3 - \ldots - \left(\binom{N}{N-2}S_{N-2} + \binom{N}{N-1}S_{(N-1)} - S_N\right)\right)}{2^{(N-1)}} \quad (11)$$

where $$\binom{N}{k} = \frac{N!}{(N-k)!k!}.$$

In the examples disclosed above, N has been an even number. While having an even number of sensors arranged as disclosed provides a pleasing symmetry in the mathematics used to determine the current, the use of an even number of sensors is not necessary. When these embodiments are extended to an odd number of sensors, appropriate changes to the equation used will be derivable by one skilled in the art. Thus the disclosed embodiments are extendable mutatis mutandis to any number of sensors N where N is greater than or equal to four.

Sensitivity Dynamic Range

Figure 2:
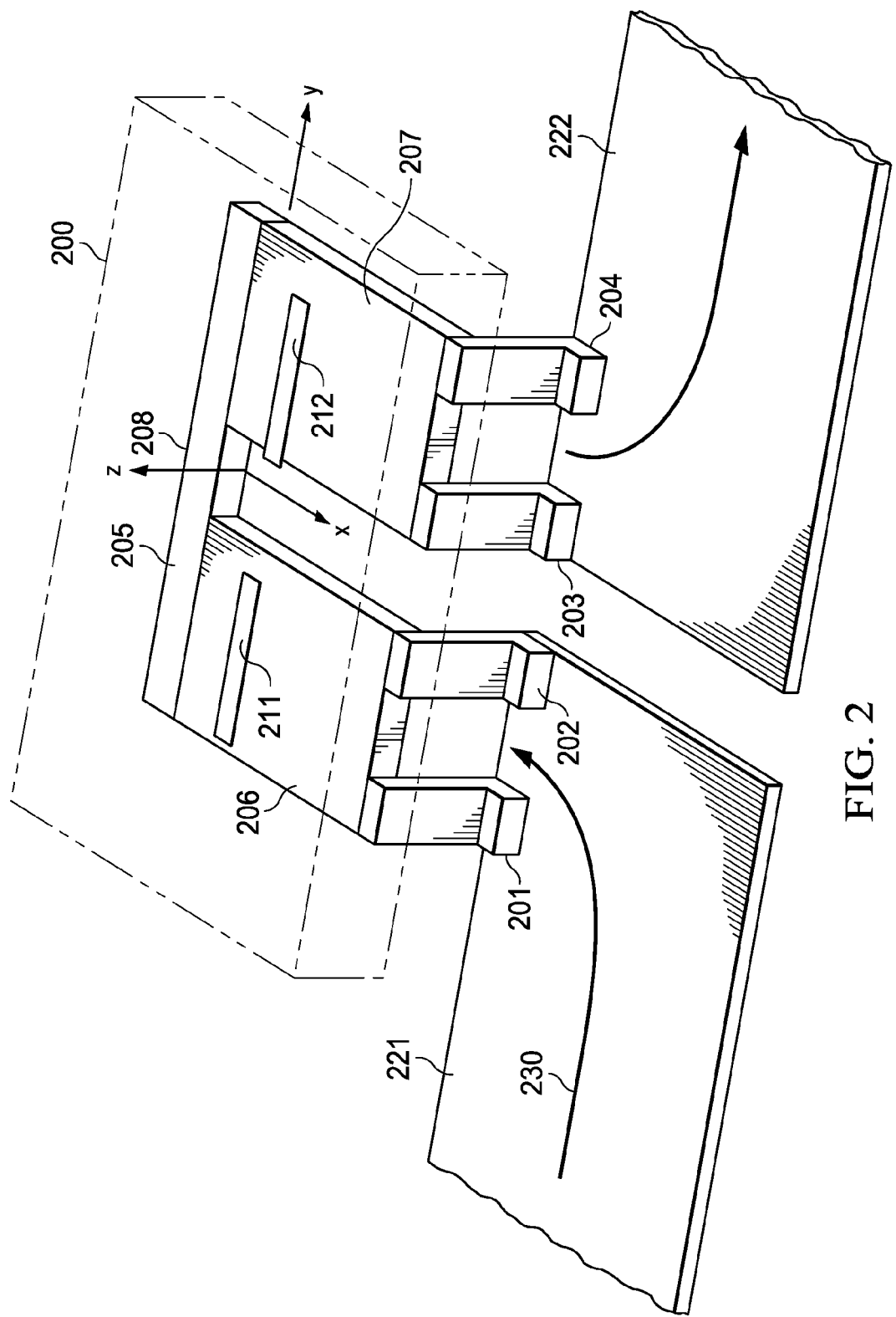
FIGS. 2-3 are illustrations of a packaged current sensor.

FIG. 2 is an illustration of a packaged current sensor 200 that is mounted on a substrate and attached to conductive traces 221 and 222 that are located on the substrate. Packaged current sensor 200 includes a conductive lead frame 205 that includes contact pins 201-204. In this example, the package is a small outline integrated circuit (SOIC) in which the pins are typically soldered to conductive pads on another substrate, such as a printed circuit board (PCB). In other embodiments, the package may be configured for other known or later developed packaging technologies, such as: through hole pins, solder bumps, etc.

A current 230 may flow from trace 221 to trace 222, or vice versa, through packaged current sensor 200 on conductive lead frame 205. Magnetometer sensors 211, 212 are mounted adjacent lead frame 205 and thereby are configured to sense a magnet field created by current flow 230. Magnetometer sensors 211, 212 may be microfluxgate sensors, or another type of known or later developed magnetometer sensor. Lead frame 205 includes parallel portions 206, 207 connected together by a loop portion 208. As explained in more detail above, lead frame 205 is configured to cause current 230 to flow in one direction adjacent sensor 211 and in an opposite direction adjacent sensor 212 on parallel portions 206, 207 in order to cancel interference produced by external magnetic fields, such as the Earth field.

Figure 3:
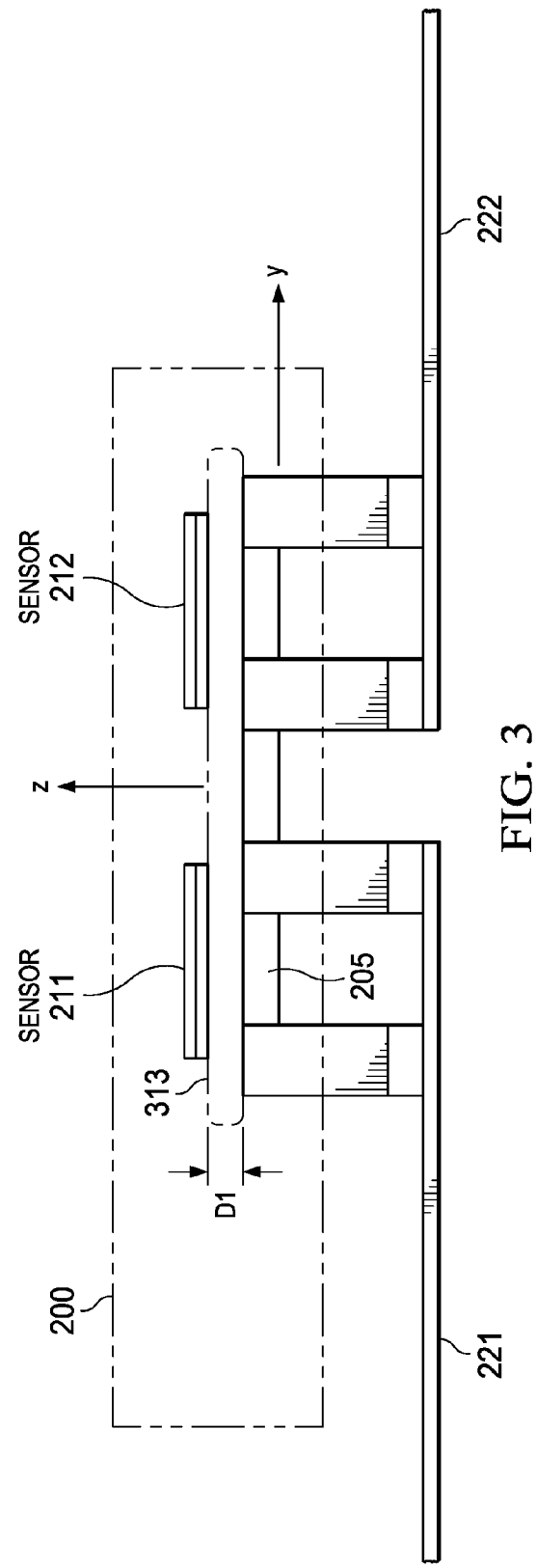

FIG. 3 is a side view of packaged current sensor 200. Typical microfluxgate sensors with internal closed loop compensation saturate at a relatively low magnetic field. For example, a microfluxgate sensor available from Texas Instruments Inc. saturates at less than 2 mT (milli Teslas). See, e.g. "DRV421 Integrated Magnetic Fluxgate Sensor for Closed-loop Current Sensing, revised July 2015, which is incorporated by reference herein.

A spacer 313 with a thickness D1 may be placed between lead frame 205 and sensors 211, 212 in order to reduce the sensitivity of the sensors to magnet flux created by current 230. This will allow the magnitude of current 230 to reach a higher value before sensors 211, 212 saturate. In this manner, the dynamic range of packaged current sensor 200 may be extended while maintaining uniform magnetic interference cancelation.

Figure 4:
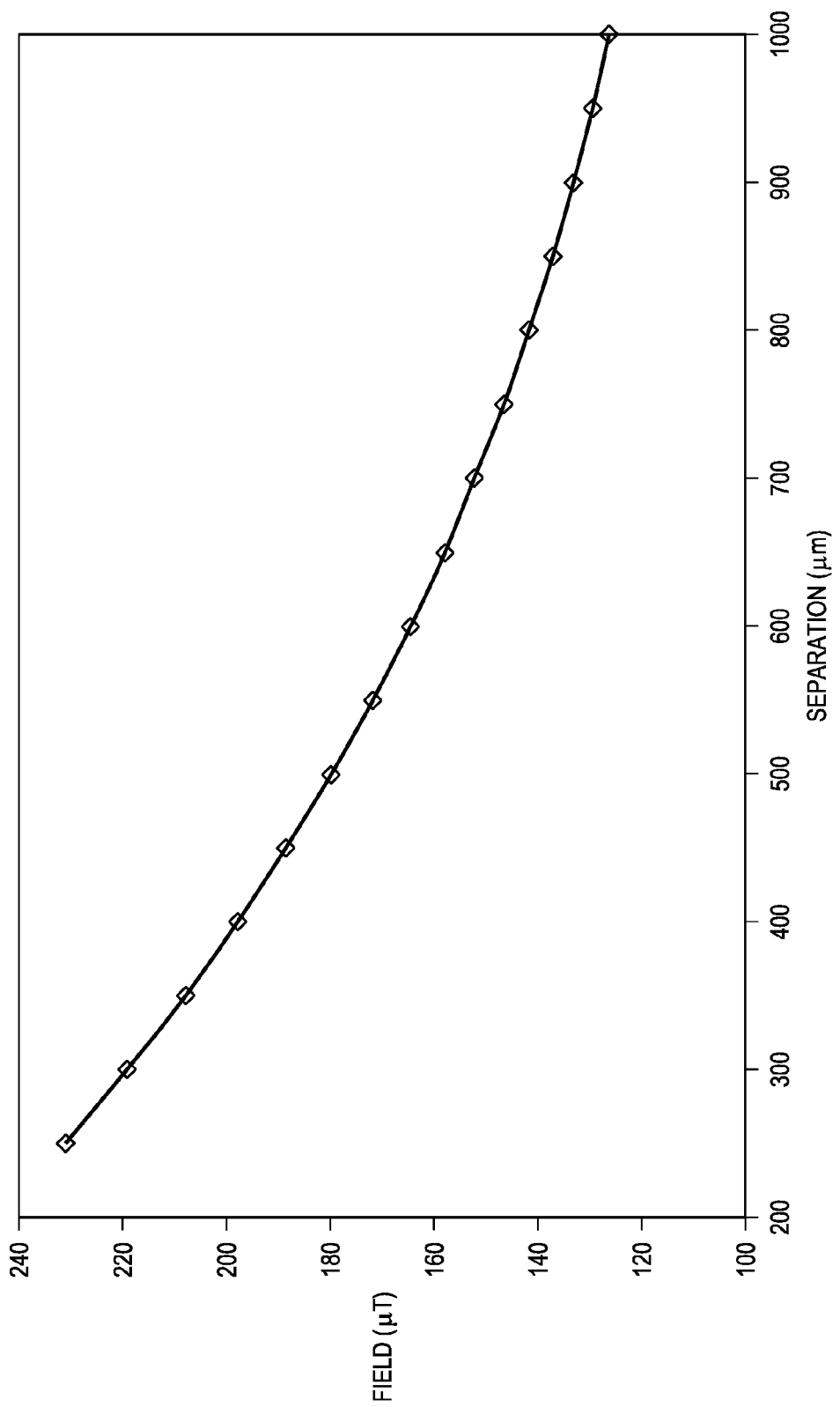
FIG. 4 is a plot illustrating field strength verses separation from a sensor.

FIG. 4 is a plot illustrating field strength verses separation D1 between a conductor carrying a 1A current such as lead frame 205 from a sensor, such as sensor 211, 212. Field strength drops as the separation between the conductive trace and the sensor increases. For example, at a separation of 300 um the field strength produced by a current of a given magnitude may be approximately 220 uT (micro Teslas), while at a separation of 1000 um, the field strength has dropped to approximately 136 uT for the same current magnitude. Thus, by spacing the sensors away from the current flow, the dynamic range of a fluxgate sensor may be increased.

Figure 5:
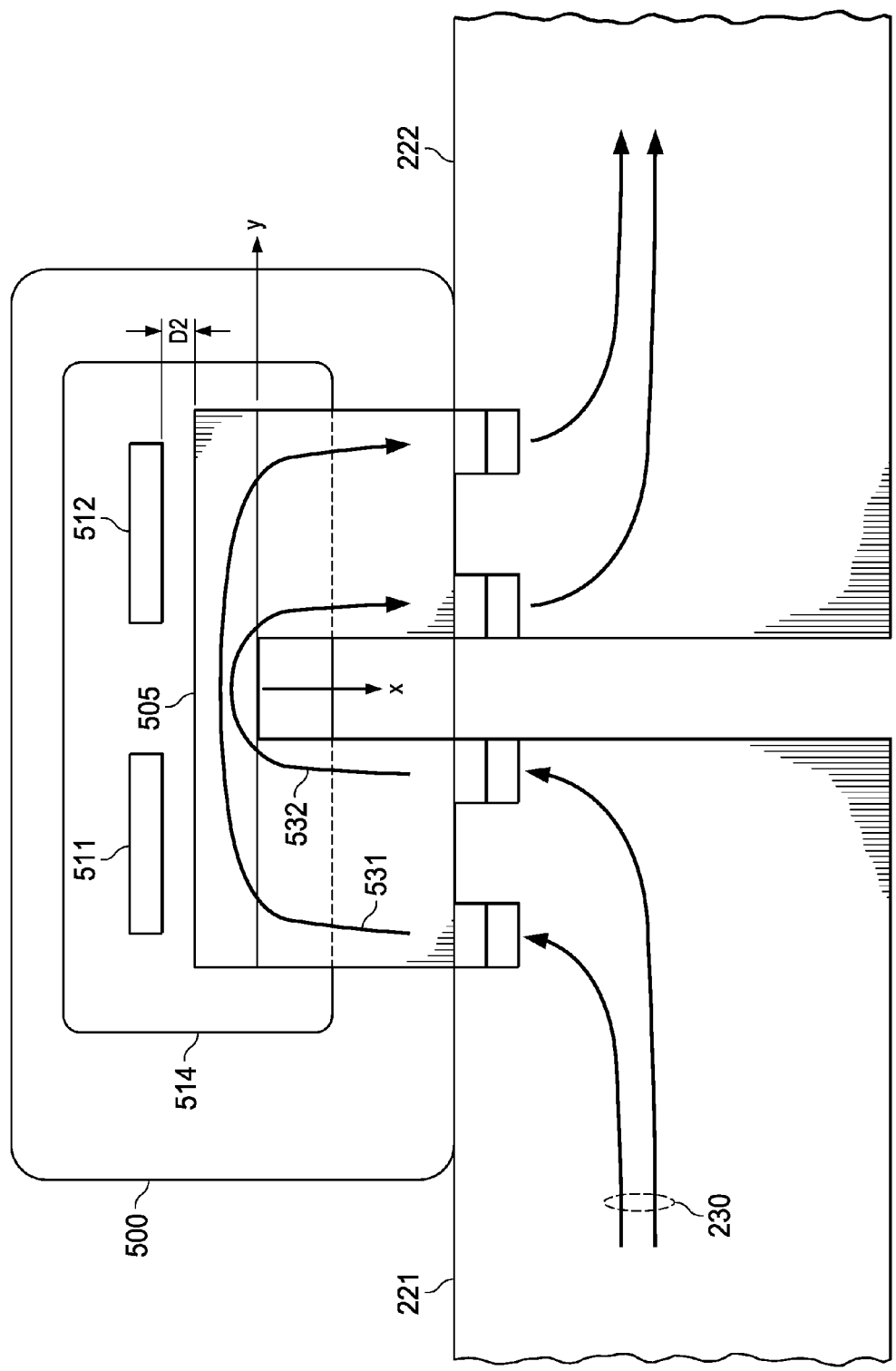
FIG. 5 is an illustration of another exemplary embodiment of a packaged current sensor with separation between the sensors and the current trace.

FIG. 5 is an illustration of another embodiment of a packaged current sensor 500 which is similar to packaged current sensor 200. However, in this embodiment the microfluxgate sensors 511, 512 are mounted on a substrate 514 that places them a distance D2 away from lead frame 505. This configuration reduces the sensitivity of sensors 511 and 512 due to the separation distance from current flow 230. In addition, a portion of current flow 230 may bypass sensor 511, 512 due to the configuration of lead frame 505. For example, a field produced by current path 532 may have less effect on sensor 511 then a field produced by current path 531. Similarly for sensor 512. In this manner, the dynamic range of fluxgate current sensor 500 may be extended while maintaining uniform magnetic interference cancellation. Table 1 illustrates the characteristics of packaged current sensor 500.

TABLE 1

| Characteristics of packaged current sensor 500 | |
| --- | --- |
| Differential Field (µT) | 48.00 |
| Common Mode Field (µT) | 0.00 + Be |
| Perpendicular field (µT) | 81.00 |
| Current Range (A) | 31.25 |
| Current Resolution (µA/√Hz) | 14.73 |

Figure 6:
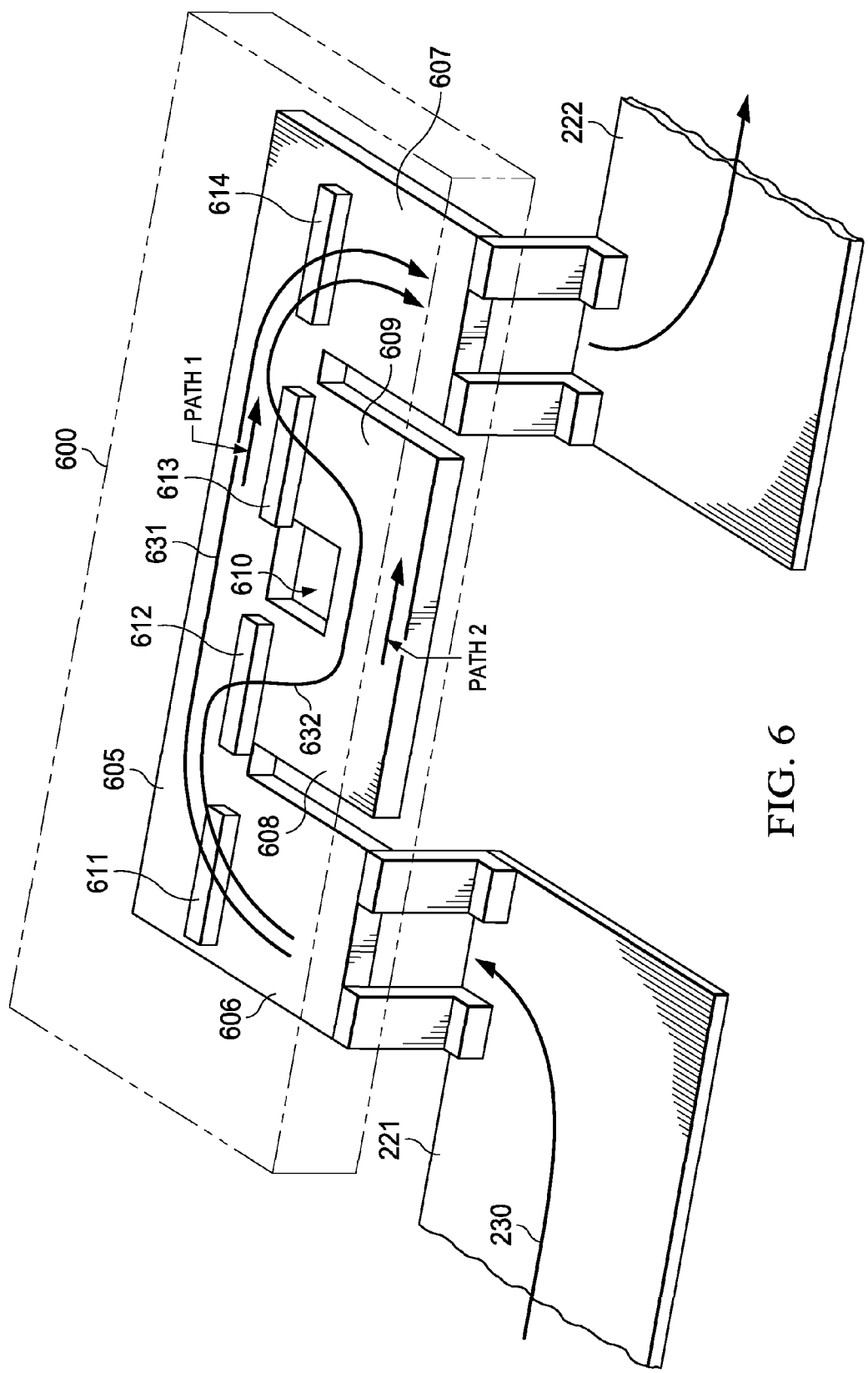
FIG. 6 is an illustration of another exemplary embodiment of a packaged current sensor with separated current paths.

FIG. 6 is an illustration of another example embodiment of a packaged current sensor 600 with separated current paths 631, 632. In this example, lead frame 605 has parallel portions 606, 607, 608, 609 joined by loop portions to provide a first current path 631 and a second current path 632. Current path 631 bypasses parallel portions 608, 609. Current path 631 is separated from current path 632 by opening 610.

In this example, a portion of current 230 flows through conductive lead frame 605 following path 631, while another portion of current 230 follows path 632. As can be seen from the illustration, all of current 230 flows by sensors 611, 614, on parallel portions 606, 607 while only a portion of current 230 flows past sensors 612, 613 on parallel portions 608, 609. This means that while sensors 611, 614 may saturate when current 230 reaches a saturation threshold value, sensors 612, 613 may continue to detect an increase in magnetic field as current 230 increases beyond the threshold value. Table 2 provides example characteristics for packaged current sensor 600. As can be seen from Table 2, path 631 acts as a "bypass" and in this example approximately 70% of current 230 flows through path 631 and only 30% of current 620 flows through path 632.

TABLE 2

Packaged current sensor 600 characteristics

| Sensor | By (uT/A) | Bx (uT/A) |
|---|---|---|
| 1 | 186.575 | 89.5677 |
| 2 | −18.6025 | 98.4569 |
| 3 | 18.3874 | 98.317 |
| 4 | −186.259 | 89.7863 |

| | |
|---|---|
| Trace Resistance (mΩ) | 0.397 |
| Lead Frame Resistance (mΩ) | 0.163 |
| Power Loss at trace @ 20 A (mW) | 158.8 |
| Power Loss at LF @ 20 A (mW) | 65.2 |
| Fraction of current thru path 1 | 0.7 |
| Fraction of current thru path 2 | 0.3 |

Figure 7:
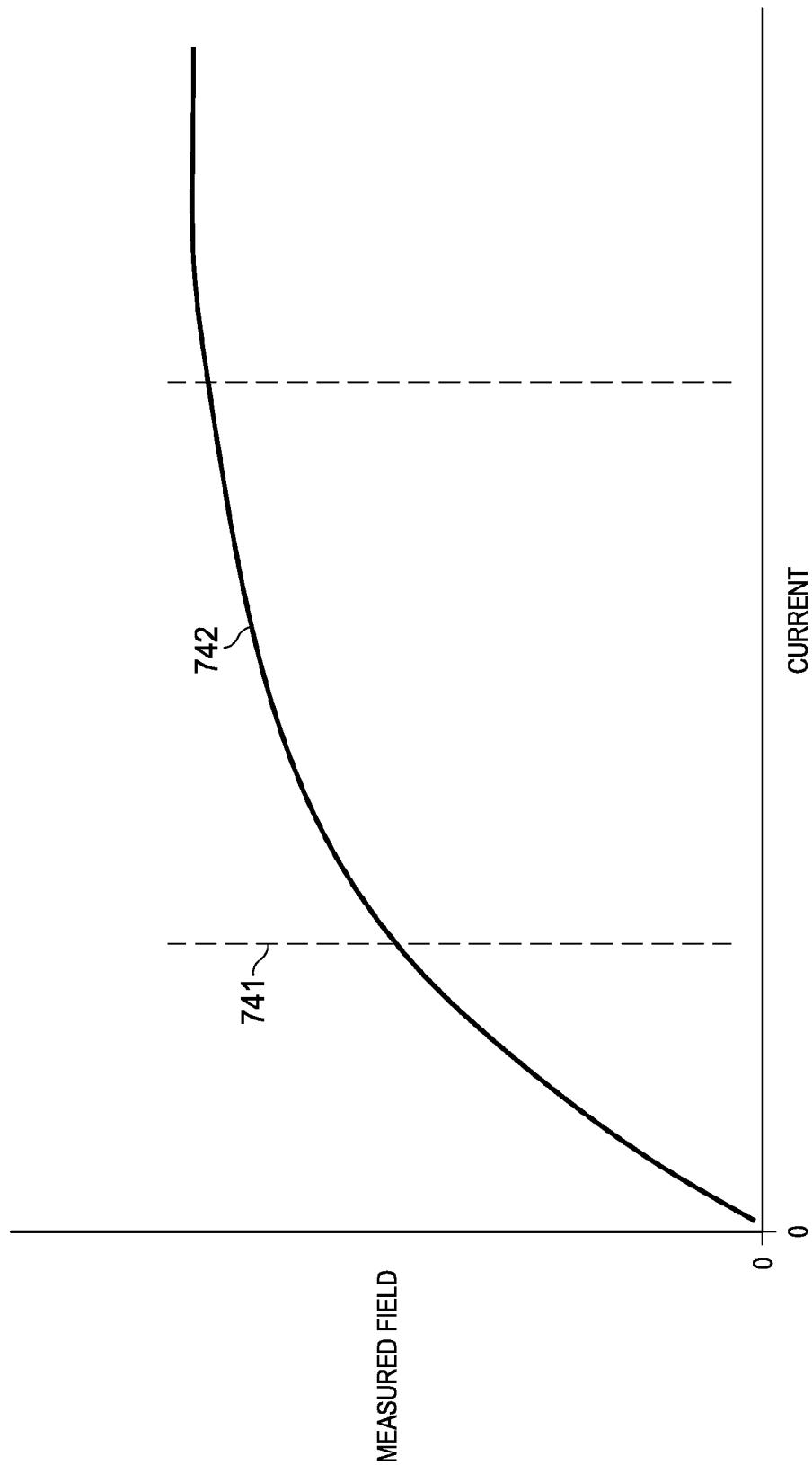
FIG. 7 is a plot of field strength vs. current for the sensor of FIG. 6.

FIG. 7 is a plot of combined field strength vs. current for the packaged current sensor of FIG. 6. This plot may be obtained taking a series of measurements and combining the readings using equation (9). In this example, while current 230 is in a range from 0 to a first saturation point as indicated at 741, all four sensors 611-614 are sensing a varying magnetic field produced by current 230. As described with regard to FIG. 1, since there are four active sensors sensing currents flowing in opposite directions, higher order magnet interference may be effectively canceled. Once the first saturation current value 741 is reached, sensors 611 and 614 may become saturated and will not be able to sense a higher magnetic field level.

As current 230 increases past the first saturation point 741, sensors 612, 613 may continue to sense increased magnetic field produced by the portion of current that is flowing current path 632 until a second saturation point 742 is reached, beyond which additional magnetic field may not be measurable by packaged current sensor 600. However, since sensor 611, 614 have become saturated, higher order magnetic field interference may not be cancelled. In this manner, the dynamic range of packaged current sensor 600 is increased from saturation point 741 to saturation point 742.

Referring again to FIG. 6, note that opening 610 provides a physical separation between first current path 631 and second current path 632. The amount of current that flows in each path may be adjusted by selecting the resistance of each path by selecting a width and/or thickness for each path. In another embodiment, opening 610 may be omitted and multiple current paths may be formed based on the size and shape of the leadframe and positioning of the sensors. For example, current may spread out uniformly through a relatively wide portion of a lead frame and the position of a sensor in the wide portion may determine a percentage of the current that is sensed by the sensor.

Figure 8:
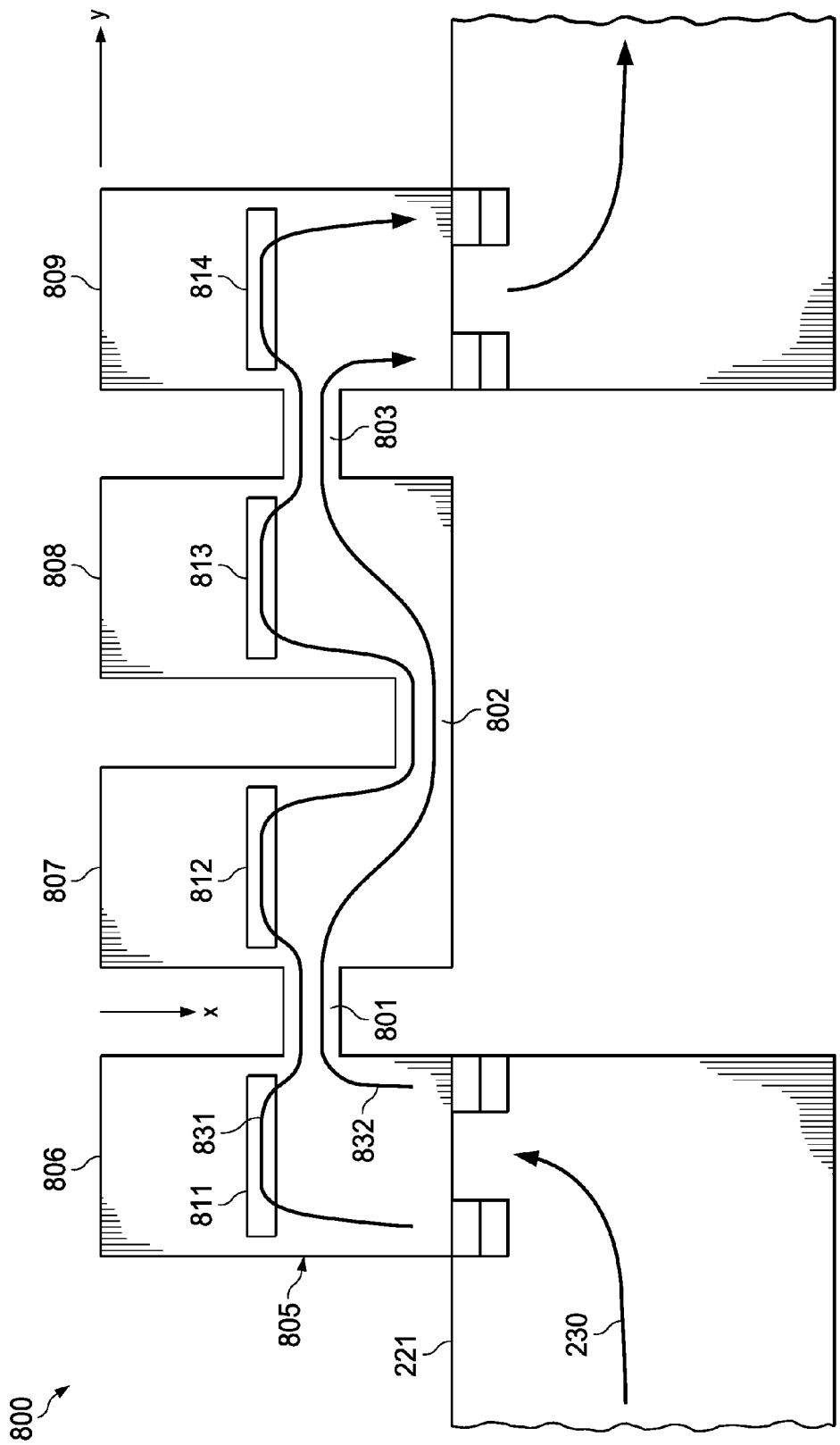
FIG. 8 is an illustration of another exemplary embodiment of a packaged current sensor with multiple current paths.

FIG. 8 is an illustration of another exemplary embodiment of a packaged current sensor 800 with multiple current paths. In this example, conductive lead frame 805 included four parallel portions 806-809 connected together by loop portions 801, 802, 803 configured to carry current 230 in a looping pattern as described in FIG. 1 in order to provide cancelation of higher order magnetic fields.

In order to increase the dynamic range of packaged current sensor 800, fluxgate sensors 811-814 are positioned on the parallel portions 806-809 so that a portion of current 230 flows around the sensors as indicated by current path 831 and a portion bypasses the sensors as indicated by current path 832. The ratio of current that flows through path 831 and 832 may be determined by the placement of loop portions 801-803, for example.

Figure 9:
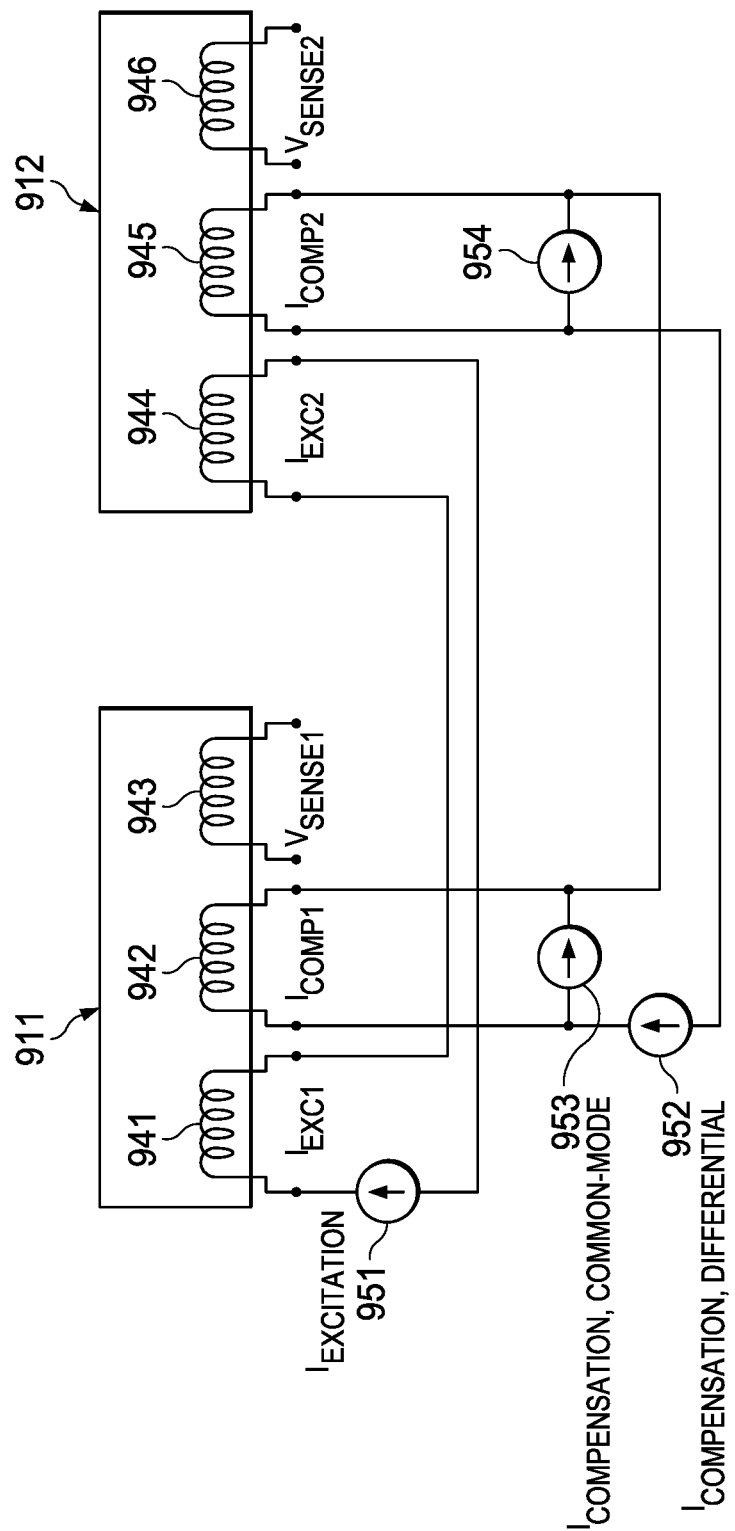
FIG. 9 is a schematic illustrating a way to save power with multiple fluxgate sensors.

FIG. 9 is a schematic illustrating a way to save power with multiple fluxgate sensors. In this example, two sensors 911, 912 are illustrated; however, the technique disclosed herein may be extended to more sensors, such as for four illustrated in FIG. 6, etc. Each fluxgate sensor has an excitation coil 941, 944 and a sensing coil 943, 946. Typically, each fluxgate sensor will also have a compensation coil 942, 945 that may be used to compensate for magnetic field interference, such as the Earth field.

In operation, each fluxgate sensor may be excited by a single AC excitation current, such as source 951, that is provided serially to both fluxgate excitation coils 941, 944. This eliminates multiple excitation currents. Furthermore, a single compensation current source 952 may provide a single differential compensation current serially to both compensation coils 942, 945. A smaller individual current source 953 may provide a common-mode compensation current to compensation coil 942, while a separate current source 954 may provide a common-mode compensation current to compensation coil 945.

In this manner, the current required for two or more fluxgate sensors is only slightly more than the current required for one fluxgate sensor, resulting in system power savings.

Figure 10:
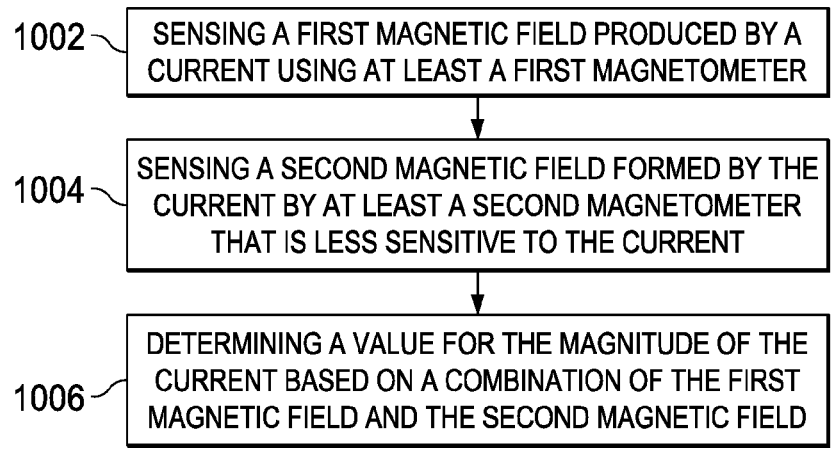
FIG. 10 is a flow chart illustrating a method for sensing current using a fluxgate based sensor.

FIG. 10 is a flow chart illustrating a method for sensing current using a fluxgate based sensor. As described in more detail above, a current is passed through a conductive trace upon which are mounted several magnetometer sensors. Typically, at least four sensors will be used in order to reduce interference from external magnetic fields, as shown in FIG. 6, for example. However, in some cases where magnetic field interference is not a problem, as few as two sensors may be used.

At least a first sensor, and typically a pair of sensors, may sense 1002 a first magnetic field produced by the current as it flows through the conductive trace. When a pair of sensors is used, the conductive trace may be arranged as two parallel portions in order to cancel interference from an external magnetic field, as illustrated in FIG. 6 for example.

At least a second sensor, and typically of pair of sensors, may sense 1004 a second magnetic field produced by the current as it flows through the conductive trace. When a pair of sensors is used, the conductive trace may be arranged as two parallel portions in order to cancel interference from an external magnetic field, as illustrated in FIG. 6 for example. The sensors may be configured so as to be less sensitive to the magnetic field produced by the current. The second sensor(s) may be spaced away from the conductive trace in order to make them less sensitive. Alternatively, the path of the current may be split either with an explicit split as shown in FIG. 6, or by a configuration of the conductive trace, as illustrated in FIG. 9, for example, so that the magnetic field sensed by the sensor(s) is produced by only a fraction of the current.

A magnitude value of the current may then be determined 1006 based on a combination of the first magnetic field strength and the second magnetic field strength using equation (9), for example. While the current is in a range from 0 to a first saturation point, all four sensors may be sensing a varying magnetic field produced by the current. As described with regard to FIG. 1, since there are four active sensors sensing currents flowing in opposite directions, higher order magnetic interference may be effectively canceled. Once a first saturation current value is reached, the first sensor(s) may become saturated and will not be able to sense a higher magnetic field level. As the current increases past the first saturation point, the second sensor(s) may continue to sense increased magnetic field produced by the portion of current that is flowing until a second saturation point is reached, beyond which additional magnetic field may not be measurable by the second sensor(s). However, since the first sensor(s) have become saturated, higher order magnetic field interference may not be cancelled. In this manner, the dynamic range of the current sensor is increased from the first saturation point to the second saturation point.

Typically, the magnitude of the current may be determined from the combined magnetic field calculated using equation (9) by using a calibrated set of data such as represented by the plot illustrated in FIG. 7.

As described above in more detail, by making the second set of sensors less sensitive to the current, the dynamic range of the current sensing device may be extended.

System Example

A packaged current sensor implemented in accordance with the techniques disclosed herein may provide high dynamic range, low interference, small form factor, low power consumption. Such a packaged current sensor may be used in various types of systems, such as: a system for Closed-Loop DC- and AC-Current Sensing, Leakage Current Sensors, Industrial Monitoring and Control Systems, etc.

Figure 11:
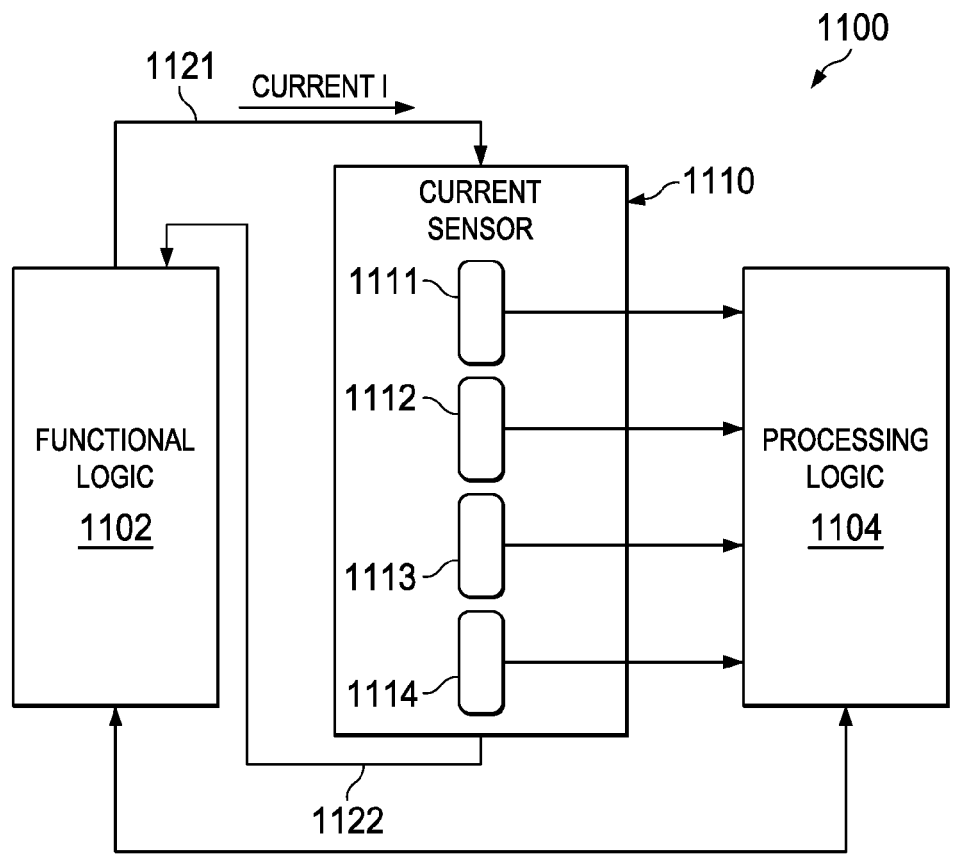
FIG. 11 is a block diagram of a system that includes a packaged current sensor.

FIG. 11 is a block diagram of a system 1100 that includes a packaged current sensor 1110. Functional logic 1102 is configured to perform a function or application for system 1100. Functional logic 1102 may produce a current I that needs to be measured as part of the function. Current I may be provided to packaged current sensor 1110 via signal traces 1121, 1122 as described in more detail above. Processing logic 1104 is coupled to packaged current sensor 1110 and is operable to receive a signal produced by a sense coil in each magnetometer 1111-1114 that indicates a magnitude of a magnetic field in the vicinity of each magnetometer 1111-1114.

Packaged current sensor 1110 may be similar to any of the sensors described herein to provide an extended dynamic range. For example, packaged current sensor 1110 may be similarly to packaged current sensor 600 or 800, referring back to FIGS. 6 and 8, respectively. Packaged current sensor 1110 may include four, or more, magnetometer sensors 1111-1114, in which two of the magnetometer sensors are arranged such that they are less sensitive to a magnetic field produced by current I in order to increase the dynamic range of packaged current sensor 1110.

Processing logic 1104 may include storage circuitry to maintain calibration data that defines a response curve for packaged current sensor 1110, similar to the plot illustrated in FIG. 7, for example. Processing logic 1104 is operable to combine the field magnitudes sensed by magnetometers 1111-1114 and to determine a current based on these magnitudes using the stored calibration data. Processing logic 1104 is coupled to functional logic 1102 to provide the results back to functional logic 1102.

System 1100 may be fabricated on a single integrated circuit (IC) as a system on a chip (SoC), for example. Alternatively, packaged current sensor 1110 may be packaged in a single IC and interconnected with other ICs that contain functional logic 1102 and processing logic 1104.

Other Embodiments

While the invention has been described with reference to illustrative embodiments, this description is not intended to be construed in a limiting sense. Various other embodiments of the invention will be apparent to persons skilled in the art upon reference to this description. For example, while a packaged current sensor using microfluxgate sensors was disclosed herein, other embodiments of the disclosure may use other types of magnetometers, Hall devices, magneto-resistive (XMR) sensor elements, such as anisotropic magneto-resistive (AMR), giant magneto-resistive (GMR), tunneling magneto-resistive (TMR) or colossal magneto-resistive (CMR), for example.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . . " Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention

What is claimed is:

1. A system comprising:
   a current measuring device, in which the device includes:
   an electrically conductive member having a first region connected in series with a second region;
   a first magnetic field based current (MFBC) sensor mounted adjacent to the first region such that the first MFBC sensor is operable to sense a first magnetic field formed by a current flowing through the first region; and
   a second MFBC sensor mounted adjacent to the second region such that the second MFBC is operable to sense only a fraction of a magnetic field formed by the current flowing through the second region.

2. The system of claim 1, in which the second region includes a first parallel portion and a second parallel portion connected together by a first loop portion, with a second loop portion also connecting the first and second parallel portions such that a space exists between the first loop portion and the second loop portion, such that a first current path is provided through the first and second parallel portions and the first loop portion and a second current path is provided through the second loop portion; and wherein the second MFBC sensor is mounted on the first parallel portion.

3. The system of claim 2, in which the first region includes a third parallel portion and a fourth parallel portion, in which the first MFBC sensor is mounted on the third parallel portion; and further including a third MFBC sensor mounted on the fourth parallel portion; and a fourth MFBC mounted on the second parallel portion.

4. The system of claim 1, in which the first region of the conductive member has a thickness and a first width, and in which the second member has approximately a same thickness and a second width, such that the second width is wider than the first width.

5. The system of claim 1, in which the first MFBC is mounted a first distance from the first region and in which the second MFBC is mounted a second distance from the second region, in which the second distance is greater than the first distance.

6. The system of claim 1, further including an excitation current source coupled in series to an excitation coil in the first MFBC sensor and an excitation coil in the second MFBC.

7. The system of claim 6, further including a compensation current source coupled in series to a compensation coil in the first MFBC sensor and a compensation coil in the second MFBC.

8. The system of claim 1, further including functional logic coupled to provide a current to be measured by the current measuring device; and processing logic coupled to the current measuring device operable to determine a magnitude of the current in response to a magnitude of the first magnetic field and a magnitude of the second magnetic field.

9. The system of claim 1, in which the first and second MFBCs are fluxgate magnetometers.

10. A method for operating a current sensor, the method comprising:

conducting a current serially through a first region and a second region of an electrically conductive member;

sensing a first magnetic field produced by the current in the first region using a first magnetic field based current (MFBC) sensor having a first sensitivity;

reducing the sensitivity of a second MFBC;

sensing a second magnetic field produced by the current in the second region using the second MFBC sensor having a reduced sensitivity, in which the reduced sensitivity is lower than the first sensitivity; and calculating a magnitude of the current based on the first magnetic field and the second magnetic field.

11. The method of claim 10, raising the current above a threshold level at which the first sensor saturates;

continuing to calculate a magnitude of the current after the first sensor saturates based on the second magnetic field.

12. The method of claim 10, in which reducing the sensitivity of the second MFBC includes spacing the second MFBC a distance away from the second region.

13. The method of claim 10, in which reducing the sensitivity of the second MFBC includes providing two current paths through the second region and in which the second magnetic field is produced primarily by current in only a first current path of the two current paths.

14. The method of claim 10, further including cancelling interference from an external magnetic field by arranging the first region to have a pair of parallel portions connected by loop region and arranging the second region to have second pair of parallel portions connected by a loop region, in which a MFBC is mounted on each parallel portion and the current flows in an opposite direction through each pair of parallel portions.

15. The method of claim 10, in which the magnitude of the current is calculated using stored calibration data.

16. The method of claim 10, further including providing an excitation current from a single source to a first excitation coil in the first MFBC sensor and to a second excitation coil in the second MFBC sensor, in which the first excitation coil and the second excitation coil are connected in series.

17. The method of claim 10, in which the first and second MFBCs are fluxgate magnetometers.

* * * * *